(12) United States Patent
Huber et al.

(10) Patent No.: US 7,170,324 B2
(45) Date of Patent: Jan. 30, 2007

(54) OUTPUT BUFFER WITH SELECTABLE SLEW RATE

(75) Inventors: Carol Ann Huber, Macungie, PA (US); John C. Kriz, Palmerton, PA (US); Brian C. Lacey, Kunkletown, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/891,048

(22) Filed: Jul. 15, 2004

(65) Prior Publication Data

US 2006/0012406 A1 Jan. 19, 2006

(51) Int. Cl.
*H03K 5/12* (2006.01)

(52) U.S. Cl. ...................... 327/170; 327/171; 327/108; 327/112; 326/82; 326/83

(58) Field of Classification Search ..................... None
See application file for complete search history.

(56) References Cited

U.S. PATENT DOCUMENTS

| | | | | |
|---|---|---|---|---|
| 5,216,293 A * | 6/1993 | Sei et al. | ...................... | 326/27 |
| 5,239,440 A | 8/1993 | Merrill | ........................ | 361/91 |
| 5,345,357 A | 9/1994 | Pianka | ........................ | 361/56 |
| 5,568,081 A * | 10/1996 | Lui et al. | ..................... | 327/380 |
| 5,926,651 A * | 7/1999 | Johnston et al. | ............... | 710/52 |
| 6,617,891 B2 * | 9/2003 | Srikanth et al. | ............ | 327/108 |
| 6,653,873 B1 * | 11/2003 | Nguyen | ....................... | 327/112 |

* cited by examiner

*Primary Examiner*—Tuan T. Lam
*Assistant Examiner*—Hiep Nguyen

(57) ABSTRACT

A buffer design for an integrated circuit that has adjustable slew rate control, yet requires significantly less space to fabricate than does a conventional buffer with slew rate control. A new slew rate control circuit design is added to a Complementary Metal Oxide Semiconductor CMOS buffer to implement slew rate control in the buffer (e.g., selection between a high slew rate and a low slew rate). The new slew rate control circuit requires significantly less space to fabricate, and when applied to each buffer in an given integrated circuit, e.g., input/output buffers that may be placed along the periphery of the integrated circuit, the savings can be extraordinary.

19 Claims, 4 Drawing Sheets

IMPROVED TRI-STATABLE OUTPUT BUFFER WITH SELECTABLE SLEW RATE

IMPROVED TRI-STATABLE OUTPUT BUFFER WITH SELECTABLE SLEW RATE

IMPROVED TRI-STATABLE OUTPUT BUFFER WITH SELECTABLE SLEW RATE

TRI-STATABLE OUTPUT BUFFER

TRI-STATABLE OUTPUT BUFFER
WITH SELECTABLE SLEW RATE

OUTPUT BUFFER WITH SELECTABLE SLEW RATE

BACKGROUND OF THE INVENTION

1. Field of the Invention

This invention relates to the design of integrated circuits. More particularly, it relates to the design of input and output buffers in an integrated circuit.

2. Background of Related Art

Integrated circuits are an important part of life as we know it today. They are the basis for most all electronic device, from telephones and answering machines to the most sophisticated computers. An important part of an integrated circuit (IC) is its ability to accept information in, and/or to pass information out. Thus, an IC must interface with the outside world.

While direct electrical connection with internal components of an IC is possible, it would leave the IC vulnerable to external voltages and currents, which may exceed the ability of the internal circuit. To provide both protection of internal components from external signals, as well as to provide amplified output signals, most signals input or output on a typical IC interfacing with the external world are 'buffered'.

A buffer is usually a more robust circuit capable of handling typical external signal levels, as well as capable of driving a given number of connections to other devices.

Though a necessary evil, buffers can prove to be a gating element of a high speed connection. In particular, while internal circuitry may be extremely fast operating, a buffer may be slower because of its relatively larger size to provide suitable protection as well as drive a suitable level of output current.

The slew rate of a buffer can be defined as the maximum rate that the output voltage of a buffer can change. Slew rate causes distortion for high frequency large signal operation. High slew rates are good from a signal standpoint as it means that the output of a buffer very quickly follows the input signal to that buffer, but it comes at the price of increased transient noise in the system. Some exemplary noise includes overshoot or undershoot of the signal beyond the desired output level caused by the very rapid ascension or fall to that level.

To balance the needs of speed of output versus the need for avoiding increased electrical noise in a circuit, CMOS buffers have been developed that allow the output slew rate to be switched between two pre-determined values. The user is given the ability to select a high slew rate to run at maximum speed, and a low slew rate to reduce noise when the maximum speed is not needed.

For instance, FIG. 3 shows a conventional tri-statable CMOS output buffer.

As shown in FIG. 3, a conventional buffer includes an output drive stage consisting of p-channel transistor M1 and n-channel transistor M2. The conventional buffer also has a pre-drive section consisting of p-channel transistors M3 and M9 and n-channel transistors M4 and M10, an AND gate X1, an OR gate X2, and an inverter X3. An input signal A is input to the buffer, as is an enable signal EN. The buffer creates an output signal PAD.

When the enable signal EN is valid or HIGH, the output of the buffer follows the logic level of the input A. When the enable signal EN is invalid or LOW, node P is high and node N is LOW, turning OFF both output transistors M1 and M2 in the output drive stage. For the purposes of clarity in this disclosure, it will be understood for the remainder of this discussion that the buffer is enabled (e.g., with HIGH enable signal EN).

The slew rate of the output signal PAD from the buffer is controlled by the speed at which nodes N and P are switched. If node N is quickly switched high by transistor M9, then transistor M2 will be quickly turned ON, resulting in a large slew rate for the high-to-low transition on the output signal PAD. Likewise, if node P is quickly pulled low by transistor M4, then transistor M1 will be quickly turned ON, resulting in a large slew rate for the low-to-high transition on the output signal PAD.

To achieve maximum speed, the pre-drive stage devices, such as the gate width of MOS pre-drive stage transistors, should be equal to about ⅓ the size of the devices of the stage that it is driving. Typical sizes of transistor M1 and transistor M2 for a high drive output could be as large as 600 um (channel width) for transistor M1, and as large as 300 um (channel width) for transistor M2. Thus, typical sizes for the channel width of transistor M3 would be 200 um, for transistor M4 would be 100 um, for transistor M9 would be 100 um, and for transistor M10 would be 50 um.

The downside of high speed operation with such a buffer is that higher slew rates necessary to achieve such high speed operation will cause more electrical noise such as transient noise in the integrated circuit. Such noise is often carried through many parts of the IC, e.g., through a power and/or ground rail. Thus, designers are often faced with a design choice between a given IC with buffers that provide a certain high slew rate at the price of higher electrical noise, and another IC with buffers that provide a lower slew rate and lower electrical noise.

In practice, many IC users want the ability to use a single chip in multiple applications. For instance, the designer might become familiar with certain aspects of a given IC, and favor it in multiple applications. In other cases, manufacturing inventory may be minimized by utilizing a same IC in multiple applications. In some of these applications, an IC with specific buffers may have to operate at high switching speeds necessitating high slew rates, but in other applications the same buffer could run at lower switching speeds utilizing lower slew rates to provide a quieter system. Thus, buffers that have a selectable slew rate were developed.

For instance, FIG. 4 shows a conventional circuit that allows the slew rate of a buffer to be switched between higher and lower slew rates.

In particular, as shown in FIG. 4, a buffer is much as it was shown with respect to FIG. 3, with the addition of an output slew rate control signal OSL used to control the output slew rate, and slew rate control circuits 402, 404.

Slew rate control is performed by the addition of n-channel transistors M5 and M6 to the pre-drive circuit driving transistor M1, and adding p-channel transistors M7 and M8 to the pre-drive circuit driving transistor M2. As shown, when the output slew rate control signal OSL is HIGH, the buffer operates at high slew rate. When the output slew rate control signal OSL is low, the buffer operates at low slew rate.

The upper slew rate control circuit 402 consists of two n-channel CMOS transistors M5, M6 connected with their drain-to-source conduction paths in parallel. M5 is a larger sized transistor used to implement the faster (high) slew rate, whereas M6 is a smaller sized transistor used to implement the slower (low) slew rate.

The gate of transistor M5 is connected to the output slew rate control signal OSL so that the gate is turned ON when the output slew rate control signal OSL is HIGH, and OFF when the output slew rate control signal OSL is LOW. An additional transistor M6, which has a very small channel width size as compared to that of transistor M5, is placed with its drain-to-source conduction path in parallel with transistor M5. The gate of transistor M6 is connected to the power supply VDD so that it is always turned ON.

The typical size of transistor M4 in the conventional buffer of FIG. 3 has a channel width of 100 um. To preserve the drive strength of the series combination of transistors M4 and M5, both transistor M4 and transistor M5 are increased to have a channel width of 200 um. This gives a drive equivalent to a single transistor having a 100 um channel width, but it increases the required fabrication area on the integrated circuit by a factor of 4 over that of an equivalent buffer not having selectable slew rate, e.g., as shown in FIG. 3.

When the output slew rate control signal OSL is HIGH, and input signal A goes HIGH, transistors M4 and M5 pull node P down quickly. This turns transistor M1 ON quickly, pulling the output signal PAD HIGH quickly. On the other hand, when the output slew rate control signal OSL is LOW, transistor M5 is turned OFF, and node P is pulled LOW through the series combination of transistors M4 and M6 when the input signal A goes HIGH. Since transistor M6 is very small, node P is pulled LOW slowly, such that transistor M1 is turned ON slowly, producing much less noise (e.g., transient noise) than if transistor M1 was turned ON by transistors M4 and M5.

Transistors M7 and M8 operate in a similar manner to control the switching speed of transistor M2. If transistor M9 in FIG. 3 had a channel width of 100 um, both it and the additional series transistor M7 must have a channel width of 200 um wide to give an equivalent drive when transistor M7 is turned ON. This too results in an area increase of a multiple of four (4) over that part of the circuit that doesn't implement slew rate selection using an output slew rate control signal OSL.

The gate of transistor M7 receives an inversion of the output slew rate control signal OSLB, which is an inverted copy of the output slew rate control signal OSL, generated by inverter X4. A p-channel transistor M8 having a very small channel width is connected in parallel with transistor M7. The gate of transistor M8 is connected to ground, so that it is always ON.

Now, when the output slew rate control signal OSL is HIGH, and input signal A goes LOW, transistor M7 is turned ON, and thus allows node N to be pulled HIGH quickly. This turns transistor M2 ON quickly, and pulls the output signal PAD LOW quickly.

When the output slew rate control signal OSL is LOW, its inverted signal OSLB is HIGH, and transistor M7 is turned OFF. Under these operating conditions, when input signal A goes LOW, node N is pulled HIGH through small transistor M8 in series with transistor M9. This means that transistor M2 will turn ON slowly, and pull the output signal PAD LOW slowly.

Because of the 4-fold area expense for portions of the buffer due to adding slew rate control to a buffer, the design of conventional buffers requires an area appreciably larger than that of buffers that do not have this feature. In the world of integrated circuits, even the smallest of savings in required area for any particular type circuit is paramount, particularly a buffer that is typically repeated many times in a given IC.

There is a need for a buffer having an adjustable slew rate design that requires less space than conventional buffers.

SUMMARY OF THE INVENTION

In accordance with the principles of the present invention, an integrated circuit including an output buffer having a selectable slew rate comprises a series connection of a first transistor and a second transistor forming a current path between a power rail and a ground rail. A third transistor is in parallel with the second transistor. A drive transistor drives an output of the integrated circuit. Only one of the second transistor and the third transistor are operable at any given moment. The output buffer operates with a fast slew rate when the second transistor is turned ON. The output buffer operates with a slow slew rate when the third transistor is turned ON and the second transistor is turned OFF.

In accordance with another aspect of the present invention, an integrated circuit including an output buffer comprises a series connection between a power rail and a ground rail. The series connection consists of a current path of a first transistor and a second transistor. The first transistor is a p-channel MOS transistor, and the second transistor is an n-channel MOS transistor. A third transistor, an n-channel MOS transistor, is in parallel with the second transistor. The third transistor has a channel width which is much smaller than a channel width of the second transistor. A slew rate logic control module controls respective gates of the first, second and third transistors such that no more than one of the second and third transistors are ON at any one time. A drive transistor drives an external output to the integrated circuit.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a buffer design for an integrated circuit that has adjustable slew rate control, yet requires significantly less space to fabricate than does a conventional buffer with slew rate control.

In accordance with the principles of the present invention, a new slew rate control circuit design is added to a Complementary Metal Oxide Semiconductor CMOS buffer to implement slew rate control in the buffer (e.g., selection between a high slew rate and a low slew rate). The new slew rate control circuit requires significantly less space to fabricate, and when applied to each buffer in an given integrated circuit, e.g., input/output buffers that may be placed along the periphery of the integrated circuit, the savings can be extraordinary.

Figure 1:
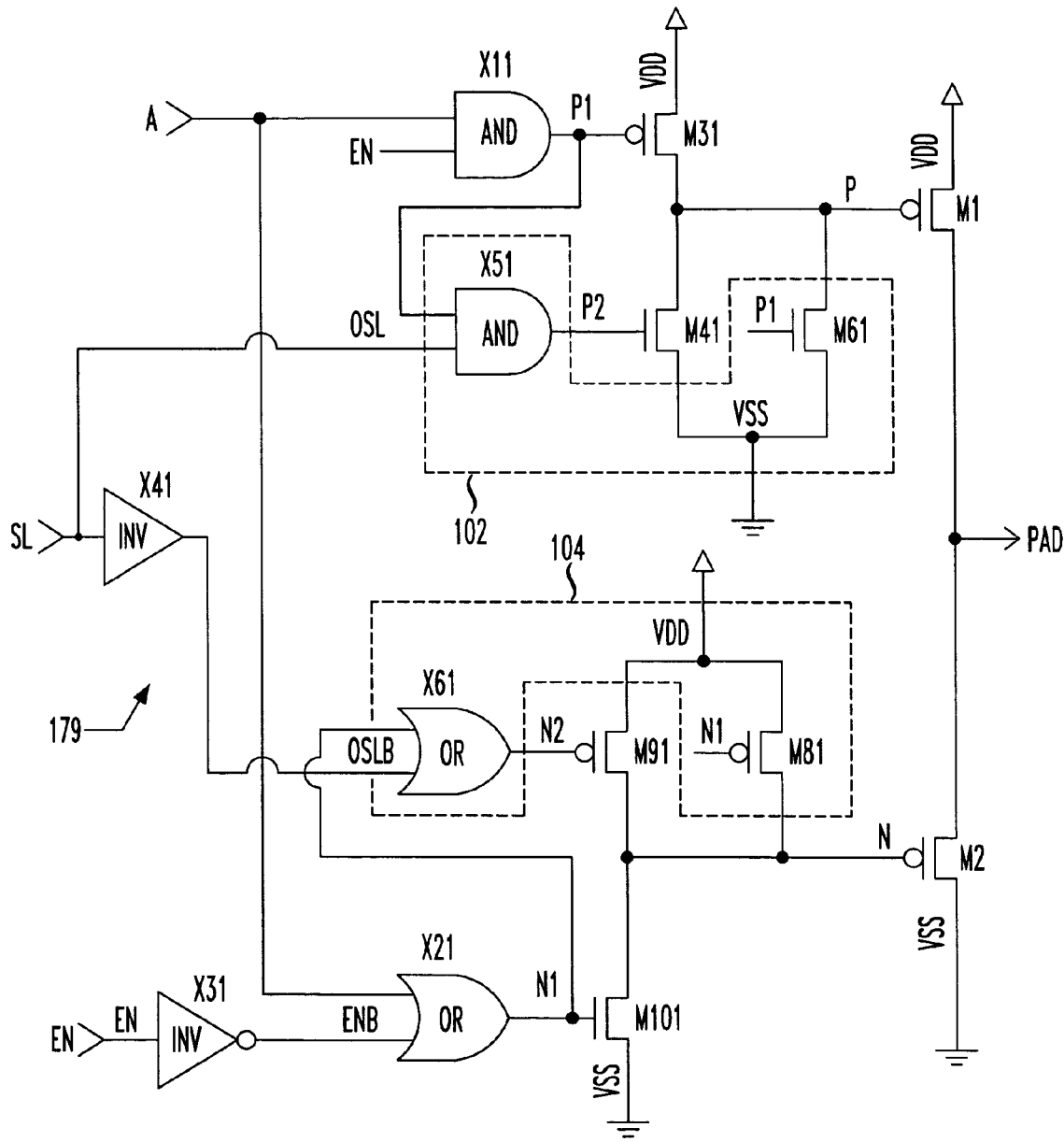
FIG. 1 shows an improved circuit including a new slew rate control circuit that includes all of the advantages provided by an adjustable slew rate buffer—without the large area penalty associated with conventional adjustable slew rate buffers, in accordance with the principles of the present invention.

FIG. 1 shows an improved circuit including a new slew rate control circuit 179 that includes all of the advantages provided by an adjustable slew rate buffer—without the large area penalty associated with conventional adjustable slew rate buffers, in accordance with the principles of the present invention.

In particular, as shown in FIG. 1, slew rate control circuits 102, 104 are provided. The slew rate control circuit 102 comprises an AND gate X51 that receives as input the output speed control signal OSL, as well as the signal at node P1. Another AND gate X11 receives the input signal A and the enable signal EN, and generates the signal at node P1. The output of the AND gate X51 drives the gate of an n-channel MOS transistor M41, which forms a current path between VDD and VSS with p-channel MOS transistor M31. The signal at node P1 also drives the gate of n-channel MOS transistor M61, which provides a current path in parallel across transistor M41. One end of the current channel of transistor M61 is connected to the node P between transistors M31 and M41, and the other end of the channel of transistor M61 is at ground (VSS) potential. The node P drives the gate of the p-channel MOS transistor M1.

The slew rate control circuit 104 includes an OR gate X61 receiving as input an inversion OSLB of the output speed control signal OSL (inverted by inverter X41), and the signal at node N1. The OR gate X61 generates an output signal at node N2, which drives the gate of p-channel MOS transistor M91. Transistor M91 forms a series connected current path with n-channel MOS transistor M101 between VDD and VSS. The gate of transistor M101 is driven by the signal at node N1, which is generated by an OR gate X21 that receives as input the input signal A together with an inversion ENB of the enable signal EN (inverted by inverter X31). Another p-channel MOS transistor M81 is connected in parallel with transistor M91, and has a gate driven by the signal at node N1. The signal at node N, formed between transistors M91 and M101, drives the gate of the output drive transistor M2.

With the buffer circuit of FIG. 1, the otherwise conventional series current path connectivity of pre-driver transistors (e.g., M4 and M5 shown in FIG. 4) is replaced by a purely parallel connectivity of two CMOS transistors M41 and M61, with small sized logic added to control the signals to the gates of the new pre-driver transistors M41 and M61. Similarly, the otherwise conventional series connectivity of pre-driver transistors M7 and M9 shown in FIG. 4 are replaced in the new design by a purely parallel connectivity of two CMOS transistors M91 and M81.

A series current path is formed between a p-channel CMOS transistor M31 and an n-channel transistor M41. For the same size drive transistors M1 and M2 as were shown in FIG. 1, pre-drive transistor M41 may have the same channel width as did transistor M4 in the conventional design shown in FIG. 4.

The pre-driver transistor M61, forming a slow slew rate control transistor, may have a relatively very small channel width. An AND gate X51 drives the gate of transistor M41.

Figure 4:
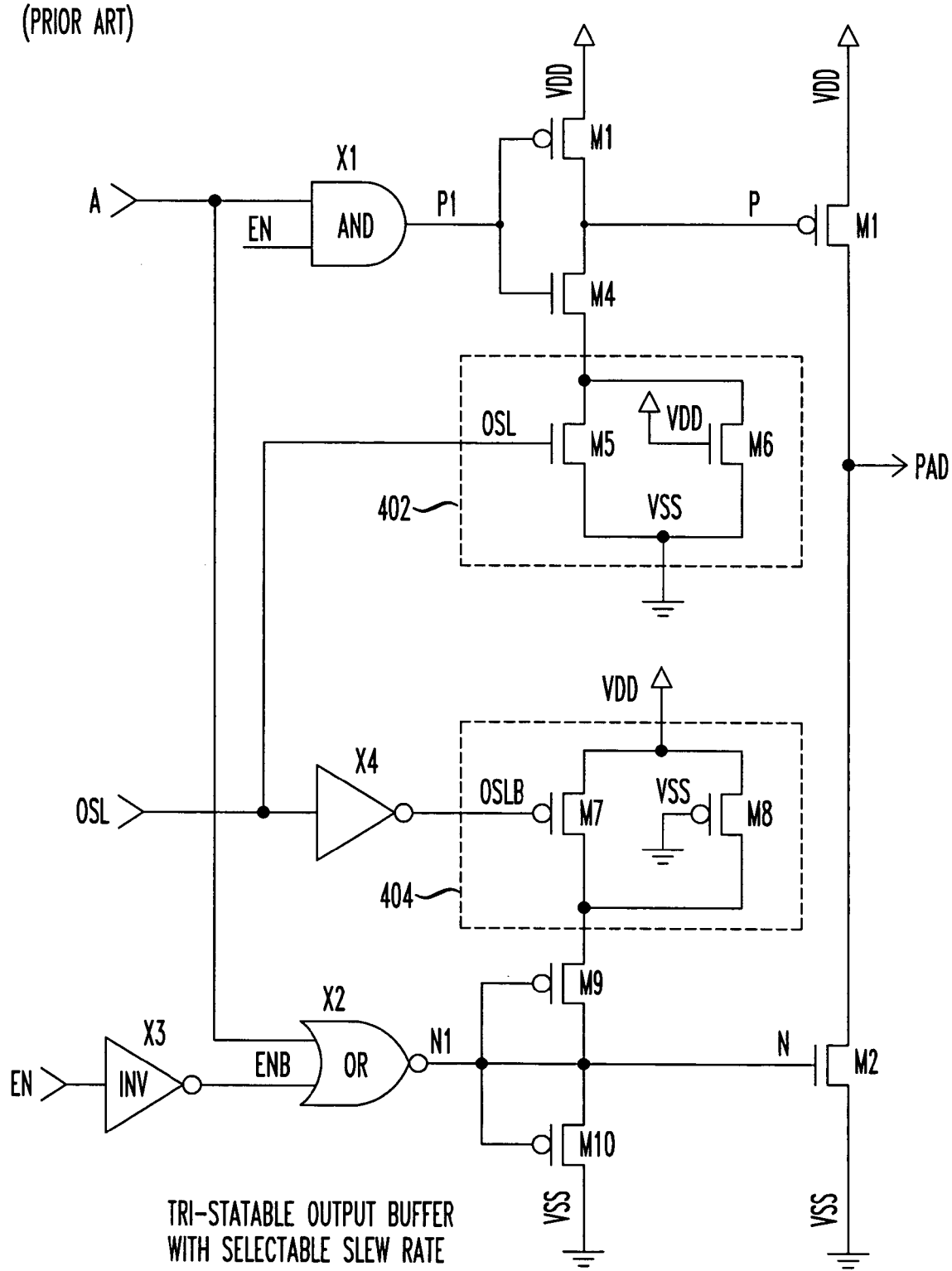
FIG. 4 shows a conventional circuit that allows the slew rate of a buffer to be switched between high and low speeds.

The gate of the small transistor M61 is driven by node P1, as opposed to being always turned ON as in the conventional slew rate control circuit shown in FIG. 4.

When the output speed control signal OSL is HIGH, node P2 is at an identical state to that of node P1, so transistor M41 will turn ON when the input signal A goes HIGH, pulling node P LOW quickly. If, on the other hand, the output speed control signal OSL is LOW, then node P2 is always LOW. At that point, when the input signal A goes HIGH, node P1 goes HIGH, but node P is pulled LOW by the small transistor M61, and thus turns a transistor M1 ON slowly, providing a slow or low slew rate.

Transistor M91 may have the same channel width in the embodiment of FIG. 1 as did transistor M9 in the otherwise conventional circuit shown in FIG. 4.

When the output speed control signal OSL is HIGH, the inversion of the output speed control signal OSLB is LOW. Thus, node N2 follows node N1. When the input signal A goes LOW, nodes N1 and N2 go LOW, and node N is quickly pulled HIGH by transistor M91. This turns transistor M2 ON quickly, pulling the output signal PAD LOW quickly.

If, on the other hand, the output speed control signal OSL is LOW, then the inversion of the output speed control signal OSLB will be HIGH, and node N2 will always be HIGH, turning transistor M91 OFF. When the input signal A goes LOW, the node N1 will go LOW as well, so that node N is pulled HIGH, albeit more slowly, through the small transistor M81. This pulls node N HIGH slowly, thus turning drive transistor M2 ON slowly, which pulls the output signal PAD LOW slowly.

Logic gates X51 and X61 add to the area of the new slew rate control circuit, but may be made from relatively small transistors because their size is not tied to the high current needs of drive transistors M1 and M2. Thus, the total area of the transistors forming logic gates X51 and X61 (which is driven by their channel width) are preferably formed to have an overall size that is much less than that saved by reducing the sizes of transistors M41 and M91 and by eliminating the need for the conventional use of series transistors M5 and M7 (FIG. 4).

Figure 2:
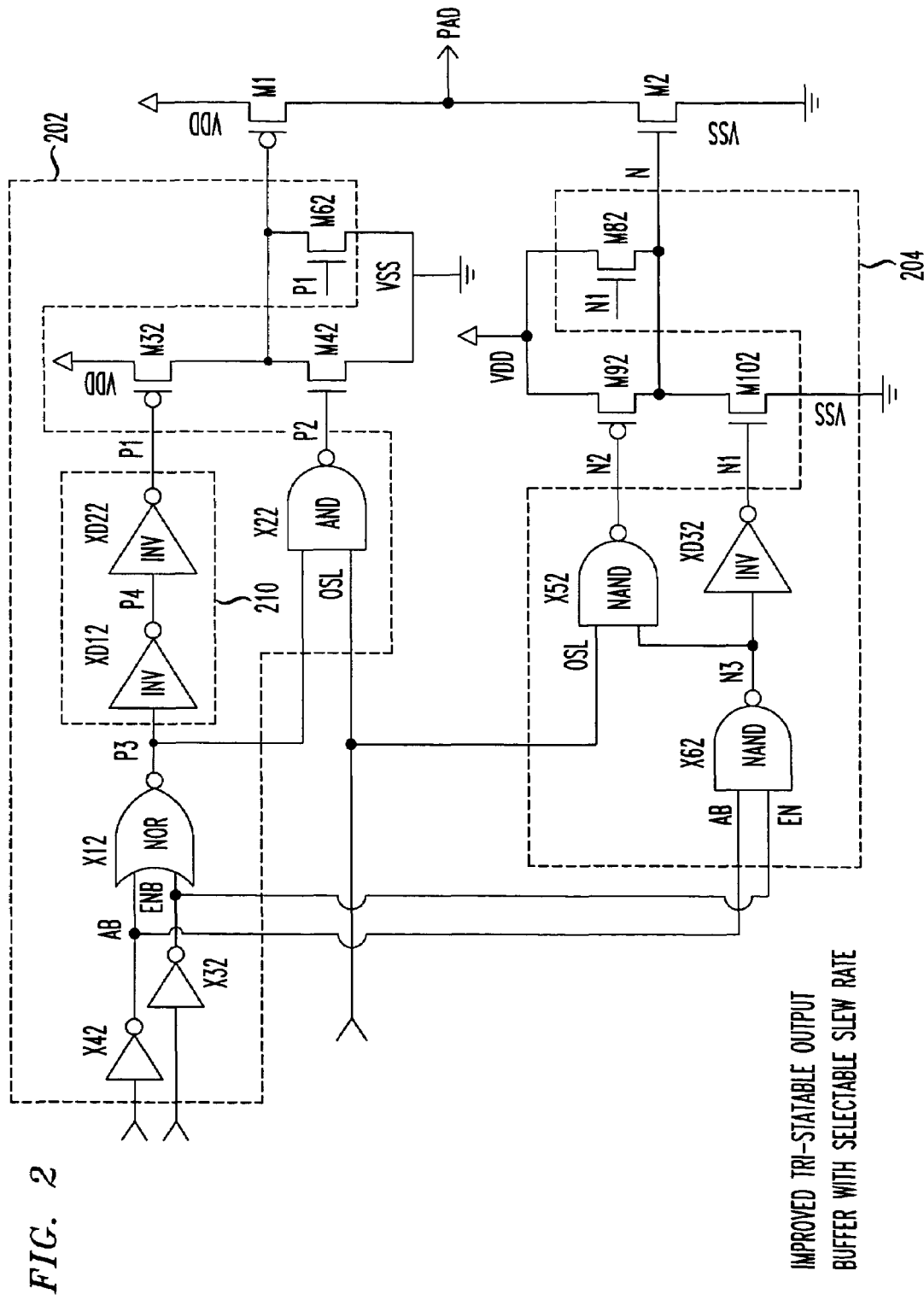
FIG. 2 shows an alternative embodiment of a CMOS output buffer having tri-state output capability as well as adjustable slew rate, in accordance with the principles of the present invention.

FIG. 2 shows an alternative embodiment of a CMOS output buffer having tri-state output capability as well as adjustable slew rate, in accordance with the principles of the present invention.

In particular, as shown in FIG. 2, a NOR gate X12 is added, with inputs comprising an inversion AB of the input signal A and an inversion ENB of the enable signal EN. The NOR gate X12 is the DeMorgan logical equivalent of the AND gate X11 of FIG. 1 having inputs A and EN. The NOR gate X12 drives the gate of n-channel MOS transistor M101, which forms a current path between VDD and VSS with p-channel MOS transistor M91.

Inverter X42 is added to invert the input signal A to provide the inversion AB of input signal A, and inverter X32 is added to invert the enable signal EN to provide the inversion ENB of enable signal EN.

A delay cell 210 is formed from, e.g., a series connection of two inverters XD12 and XD22.

In the upper slew rate control circuit 202, a series combination of p-channel MOS transistor M32 and n-channel MOS transistor M42 form a path between VDD and VSS, and an n-channel MOS transistor is connected in parallel to transistor M42. A node between transistors M42 and M32 drives the gate of the p-channel MOS output drive transistor M1. The gate of transistor M62 is driven by the output of the delay cell 210. The gate of transistor M42 is driven by the output of an AND gate X22, ANDing the output speed control signal OSL with the output of NOR gate X12.

The delay cell 210 in the upper slew rate control circuit 202 ensures that the delay of the signal at node P1 relative to the signal at node P3 is matched (preferably identically) to the delay caused by AND gate X22, of the signal at node P2 relative to the signal at node P3. This ensures that transistors M32, M42, and M62 switch at the same time.

In the slew rate control circuit 204, a NAND gate X62 is added, with inputs comprising the inversion of the input signal AB and the enable signal EN. The NAND gate X62 is the DeMorgan logical equivalent of the OR gate X21 of FIG. 1 having inputs A and ENB and an output generating the signal at node N3.

A NAND gate X52 ANDs the output speed control signal OSL with the signal at node N3, and inverts the ANDed combination, to drive the gate of a p-channel MOS transistor M92. Transistor M92 is connected in series with n-channel MOS transistor M102 to form a series current path between VDD and VSS. A p-channel MOS transistor M82 is connected in parallel to transistor M92, and is driven by an inversion of the signal at node N3.

The inversion of the signal at node N3 is generated by an inverter XD32, which delays the signal from node N3 going to node N1 by the same amount that the NAND gate X52 delays the signal from node N3 to node N2. This ensures that transistors M82, M92 and M102 are switched at the same time. A node between transistors M92 and M102 forms a node N that drives the gate of output transistor M2.

Figure 3:
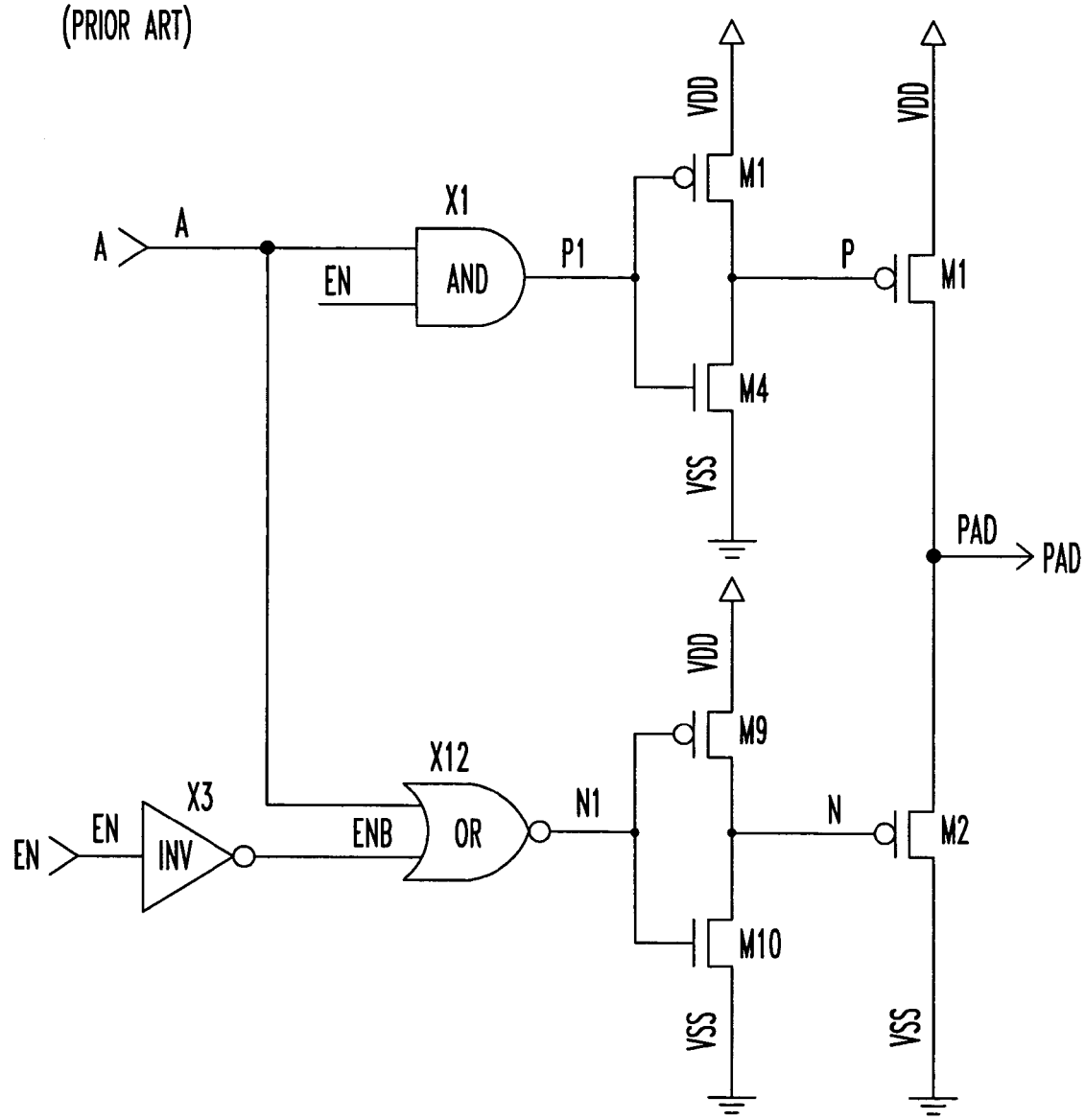
FIG. 3 shows a conventional tri-stateable CMOS output buffer.

The output transistors M1 and M2 as shown in FIGS. 1 and 2 are formed as otherwise conventional transistors, e.g., as shown in FIGS. 3 and 4.

Accordingly, the area required to form multiple buffers (input and/or output buffers) with selectable slew rate control can be significantly reduced as compared with conventional buffers having slew rate adjustability.

While the invention has been disclosed with respect to provision of an integrated circuit with two user-selectable slew rates, the invention could further be used to provide more than two slew rates. For instance, based on disclosed techniques for providing two user-selectable slew rates, one skilled in the art could arrange switching circuitry to control operation of 'n' parallel conduction path transistors to provide an integrated circuit with a corresponding 'n' possible slew rates to select from.

While the invention has been described with reference to the exemplary embodiments thereof, those skilled in the art will be able to make various modifications to the described embodiments of the invention without departing from the true spirit and scope of the invention.

What is claimed is:

1. An integrated circuit including an output buffer having a selectable slew rate, comprising:
   a series connection of a first transistor and a second transistor forming a current path between a first voltage rail and a second voltage rail;
   a third transistor in parallel with said second transistor;
   a drive transistor, controlled by said series connection of said first transistor and said second transistor, to drive an output buffer of said integrated circuit;
   a first AND equivalent logic function driving a gate of said first transistor and a gate of said third transistor; and
   a second AND equivalent logic function driving said second transistor;
   wherein said output buffer operates with a fast slew rate when said second transistor is turned ON; and
   said output buffer operates with a slow slew rate when said third transistor is turned ON and said second transistor is turned OFF.

2. The integrated circuit including an output buffer having a selectable slew rate according to claim 1, wherein:
   only one of said second transistor and said third transistor are operable to an ON state at a time.

3. The integrated circuit including an output buffer having a selectable slew rate according to claim 1, wherein:
   said first voltage rail is a power rail.

4. The integrated circuit including an output buffer having a selectable slew rate according to claim 1, wherein:
   said second voltage rail is a ground rail.

5. The integrated circuit including an output buffer having a selectable slew rate according to claim 1, wherein said second transistor comprises:
   an n-channel CMOS transistor.

6. The integrated circuit including an output buffer having a selectable slew rate according to claim 5, wherein said third transistor comprises:
   an n-channel CMOS transistor.

7. The integrated circuit including an output buffer having a selectable slew rate according to claim 1, wherein said third transistor comprises:
   an n-channel CMOS transistor.

8. The integrated circuit including an output buffer having a selectable slew rate according to claim 6, wherein:
   said third transistor comprises a channel width of no greater than ⅓ a channel width of said second transistor.

9. An integrated circuit including an output buffer having a selectable slew rate, comprising:
   a series connection of a first transistor and a second transistor forming a current path between a first voltage rail and a second voltage rail;
   a third transistor in parallel with said second transistor;
   a drive transistor, controlled by said series connection of said first transistor and said second transistor, to drive an output buffer of said integrated circuit;
   an AND equivalent logic function driving a gate of said first transistor and a gate of said third transistor; and
   a delay circuit between said AND equivalent logic function and a gate of said first transistor;
   wherein said output buffer operates with a fast slew rate when said second transistor is turned ON; and
   said output buffer operates with a slow slew rate when said third transistor is turned ON and said second transistor is turned OFF.

10. An integrated circuit including an output buffer, comprising:
    a series connection between a first voltage rail and a second voltage rail, said series connection consisting of a current path of a first, p-channel MOS transistor, and a second, n-channel MOS transistor;
    a third, n-channel MOS transistor in parallel with said second transistor, said third transistor having a channel width which is much smaller than a channel width of said second transistor;
    a slew rate logic control module to control respective gates of said first, second and third transistors;
    a drive transistor to drive an external output to said integrated circuit;
    a first AND logic function controlling a gate of said first transistor and said third transistor; and
    a second AND logic function controlling a gate of said second transistor.

11. The integrated circuit including an output buffer according to claim 10, wherein:
    said slew rate logic control module controls respective gates of said first, second and third transistors such that no more than one of said second and third transistors are ON at any one time.

12. The integrated circuit including an output buffer according to claim 10, wherein:
    said first voltage rail is a power rail.

13. The integrated circuit including an output buffer according to claim 10, wherein:

said second voltage rail is a ground rail.

14. The integrated circuit including an output buffer according to claim 10, further comprising:
a delay circuit between said first AND logic function and said gate of said first transistor.

15. The integrated circuit including an output buffer according to claim 13, further comprising:
another series connection between said first voltage rail and said second voltage rail, said another series connection consisting of a current path of a fourth, p-channel MOS transistor, and a fifth, n-channel MOS transistor;
a sixth, n-channel MOS transistor in parallel with said fourth transistor, said sixth transistor having a channel width which is much smaller than a channel width of said fourth transistor;
another slew rate logic control module to control respective gates of said fourth, fifth and sixth transistors such that no more than one of said fourth and sixth transistors are ON at any one time; and
another drive transistor, controlled by said another series connection, to drive said external output to said integrated circuit.

16. The integrated circuit including an output buffer according to claim 15, wherein:
said drive transistor comprises a p-channel MOS transistor; and
said another drive transistor comprises an n-channel MOS transistor.

17. An integrated circuit including an output buffer having a selectable slew rate, comprising:
only two transistors with conduction paths in series between a first voltage rail and a second voltage rail;
at least a first one of said only two transistors having a third transistor having a conduction path in parallel with a conduction path thereof;
a drive transistor to drive an output buffer of said integrated circuit;
a first AND equivalent logic function driving a gate of said first one of said only two transistors and a gate of said third transistor; and
a second AND equivalent logic function driving a second one of said only two transistors;
wherein said output buffer operates with a fast slew rate when said second transistor is turned ON; and
said output buffer operates with a slow slew rate when said second transistor is turned OFF.

18. The integrated circuit including an output buffer having a selectable slew rate according to claim 17, wherein:
said first voltage rail is a power rail.

19. The integrated circuit including an output buffer having a selectable slew rate according to claim 17, wherein:
said second voltage rail is a ground rail.

* * * * *